(12) United States Patent
Uber et al.

(10) Patent No.: US 6,438,159 B1
(45) Date of Patent: Aug. 20, 2002

(54) METHOD AND APPARATUS FOR MARGINING ERROR RATE OF MULTI-DROP DATA BUSES

(75) Inventors: Richard Uber, Marlborough; Bruce Leshay, West Boylston, both of MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/250,978

(22) Filed: Feb. 16, 1999

(51) Int. Cl.$^7$ ...................... H04B 17/00; G06F 15/173

(52) U.S. Cl. ........................................ 375/225; 709/223

(58) Field of Search .......................... 710/66, 29, 110, 710/60; 709/219, 223; 711/5; 375/257, 220, 225

(56) References Cited

U.S. PATENT DOCUMENTS

| | | | | |
|---|---|---|---|---|
| 4,476,527 A | * | 10/1984 | Clayton, IV | 710/29 |
| 5,687,341 A | * | 11/1997 | Ducateau | 365/230.02 |
| 6,051,990 A | | 4/2000 | Uber | 326/33 |
| 6,240,477 B1 | * | 5/2001 | Erkinger et al. | 709/202 |

* cited by examiner

Primary Examiner—Stephen Chin
Assistant Examiner—Kevin Kim
(74) Attorney, Agent, or Firm—David M. Sigmond

(57) ABSTRACT

Method and apparatus for optimizing data transfer over a terminated low voltage differential bus includes controlling parameters of a bus driver, a bus bias cancellation circuit, and other bus operating parameters, in response to received test results derived from test patterns sent over the bus at various transfer rates and parameter settings until optimized parameter settings within an acceptable error margin and at a highest available transfer rate are determined between a particular sending unit and a particular receiving unit on the bus.

30 Claims, 4 Drawing Sheets

METHOD AND APPARATUS FOR MARGINING ERROR RATE OF MULTI-DROP DATA BUSES

FIELD OF THE INVENTION

This invention relates generally to the field of digital data transmission lines and buses. More particularly, the present invention relates to an efficient method for measuring error-rate or noise margins on a digital data bus, such as a low voltage differential data bus, and for establishing maximum data transfer rates in response to the measurement.

BACKGROUND OF THE INVENTION

Buses are used to interconnect components and elements of digital computing systems. A bus is a collection of wires in a cable or conductive traces on a printed circuit board, or other signaling medium or paths, such as an optical fiber channel or path, which transmit data, status and control signals. A bus may also typically supply operating power and ground return paths via electrical conductors. A bus between physically separate computing systems is frequently referred to as a network.

Standard buses and bus structures have become widespread in digital computing. One family of bus structures is known as Small Computer System Interface, or "SCSI". The SCSI bus structure has become standardized, as specified by document S3.131-1986 published by the American National Standards Institute (ANSI) in June 1986. The SCSI bus enabled e.g. eight computer central processing units (CPUs) and computer peripherals to be interconnected, and provided a defined physical interconnect and a signaling construct enabling exchange of data between interconnecting computing/storage subsystems, etc.

One recent improvement to the SCSI bus has been a low voltage differential bus structure (LVD SCSI). This LVD SCSI bus structure includes a pair of signal paths or wires for each logical signal, and each path has a signaling range of only approximately 400 millivolts, e.g. 1.1volts to 1.5volts. Two differential signal lines can hold two binary states. The voltages (1.5volts, 1.1volts) on the two lines represent a first binary state, while the reverse voltages (1.1 volts, 1.5volts) on the same two lines represent a second binary state opposite of the first state. While the voltages in this example are not absolute, it is a characteristic of LVD SCSI buses that the voltage difference between the two lines (e.g. 0.4 volts) is much smaller than the average voltage on the two lines (e.g. 1.3 volts). This very narrow signaling range presents unique design requirements and challenges to interface circuits supporting connections to this particular bus structure. These requirements and challenges become even more acute when bus speeds are increased.

Difficult design tradeoffs have been faced in trying to double speeds on LVD SCSI buses from e.g. 40 megatransfers per second to 80 megatransfers per second. These tradeoffs pit desired higher bus speed against long cable runs and low power operation. Since devices connected to the LVD SCSI bus have no prior knowledge or information concerning the physical length of the particular bus, the bus length must be limited to a physical length over which reliable operation can be guaranteed with all system components being simultaneously rated at worst case tolerances.

It is known within the computer modulator/demodulator ("modem") art to provide a functional fallback mode when a modem encounters data errors while operating at a highest possible transmission speed. In the case of error detection the modem switches to a lower transmission speed. Adjustment of transmission speed involves interaction with higher levels of operating system software and represents a single adjustable variable within the system.

In multi-device ("multi-drop") computer data buses some form of bias must be applied to the bus in order to cause a known state to exist during bus idle intervals when none of the devices ("drops") is active. Bus terminators connected to SCSI buses bias all undriven bus lines or pins to a negation state. This bus bias condition leads to a requirement that active drivers source different drive levels to establish logical assertion and negation levels. When driving a negation level (logical false), the terminator bias aids the driver. When driving an assertion level (logical true), the terminator bias opposes the driver and a stronger signal must be driven onto the bus.

In order to overcome the terminator bias, a hybrid approach employing two sets of current mode drivers is disclosed in commonly assigned, co-pending U.S. patent application Ser. No. 08/969,375 by co-inventor Uber, filed on Nov. 13, 1997, for "Asymmetric Current Mode Driver for Differential Transmission Lines", the disclosure thereof being incorporated herein by reference. In that prior approach one set of current mode drivers was used to drive an assertion polarity current which is approximately equal to the negation polarity current sourced by the terminators on the bus. A second set comprised drivers of switchable polarity, which were used to drive symmetrical signals onto the bus.

There are multiple causes of signal quality degradation on the bus. Such causes include tolerance ranges on the negation current from the terminator; tolerance ranges on the bias cancellation current sourced by the SCSI device; imbalance in the symmetry of the symmetrical signal driver; amplitude of the signal from the symmetrical signal driver; attenuation of signals on the cable or printed circuit board bus; line impedance changes along the bus; capacitance mismatch of loads along the bus; threshold variations on the detector located in the SCSI device which receives the data transmitted along the bus; inter-symbol interference (which is the dependence of waveform on the data pattern being transmitted); and/or crosstalk among signals driven on the bus.

Considerable speed performance improvement and potential bus length is sacrificed because current SCSI system designs are limited by simultaneous worst case conditions and parameters. These conditions and parameters include worst case cable length; worst case cable attenuation; worst case impedance near the destination device; worst case input threshold variation at the destination; worst case terminator negation current imbalance; worst case driver terminator cancellation current imbalance; and worst case crosstalk.

A hitherto unsolved need has therefore remained for a practical method to reduce the deleterious effects of these causes and design compromises, leading to corresponding improvements in signal speed and quality, and increases in system practical bus lengths.

SUMMARY OF THE INVENTION WITH OBJECTS

One object of the present invention is to provide a method for improving signaling margin of a data bus by employing a system perspective instead of a device-by-device or component-by-component perspective.

Another object of the present invention is to provide intelligent compensation to interconnected resources on a bus by iterative error rate margining adjustment of one or plural predetermined bus drive parameters.

Another object is to provide a signaling method for improving performance by enabling each sender/receiver pair on a data bus to transfer data across the bus at a fastest reliable data rate.

One more object of the present invention is to improve data transfer speed and reliability across a terminated low voltage differential Small Computing System Interface (LVD SCSI) bus.

In accordance with one aspect of the present invention, a method for margining error rate of a multi-drop data bus, such as a LVD SCSI bus includes the steps of:

determining a lowest acceptable level of a predetermined parameter, such as sending drive current, at a first, highest nominal data transmission rate across the data bus, determining a highest acceptable level of the predetermined parameter at said transmission rate across the data bus, determining whether a difference between determined lowest acceptable level and determined highest acceptable level is greater than a predetermined minimum error margin, and if so, setting the predetermined parameter to a nominal level lying between the determined lowest acceptable level and the highest acceptable level at said first data transmission rate, and if not, repeating the steps of lowest and highest acceptable levels at progressively reduced data transmission rate until the difference is determined to be greater than the predetermined minimum margin, and setting the predetermined parameter to a nominal level lying between the determined lowest acceptable level and the highest acceptable level at the reduced transmission rate.

In another aspect of the present invention, a method optimizes data transfer rate across a data bus to which a plurality of devices are attached. Each device includes a sending element and a receiving element. The bus supports a high speed synchronous transfer mode and a lower speed a synchronous transfer node. The bus receives termination bias current from at least one, and frequently several bus terminator(s). The sending device includes a controlled current mode driver, a controlled bias cancellation circuit, or other bus driving circuit with variable drive parameters, and a programmed digital processor for controlling the bus drive parameters. At the sending device the optimization method includes steps of:

setting a first predetermined bus drive operating parameter (such as one of drive current; termination bias cancellation current; optimization of a signal current amplitude, transient slew rate or common mode voltage; application of intersymbol intereference compensation techniques or strengths) of the current mode driver to a value within a first range of values, and sending a test pattern including the first predetermined bus drive operating parameter at the value at a first transfer rate within a range of transfer rates. The steps of setting and sending are repeated such that the test pattern may include a plurality of parameters having a plurality of value settings, and the transfer rate may also be varied.

At a receiving device connected to the bus, the method includes steps of:

detecting test pattern errors at each setting within the first range of values and at each transfer rate, determining an acceptable least errors combination of settings of the first setting range and highest transfer rate, and otherwise signaling the sending device to reduce synchronous transmission speed to a lower transfer rate and then repeat the steps of setting and sending the test pattern.

This iterative tuning process is carried out between the sending and the receiving devices on the bus until an acceptable least errors combination of settings of the first and second ranges is determined for each device.

The sending method may include setting second or more predetermined parameters to a plurality of values within a second or further range, and sending the test pattern including both the first parameter and the second or more parameters within the test pattern.

In a related aspect of the present invention a sending device connected to a terminated bus, such as a terminated LVD SCSI bus, optimizes parameters of its data driver and its bias cancellation circuit in response to test patterns sent over the bus and received and checked by another device connected to the bus.

These and other objects, advantages, aspects, and features of the present invention will be more fully appreciated and understood upon consideration of the following detailed description of preferred embodiments presented in conjunction with the accompanying drawings.

DETAILED DESCRIPTION OF PREFERRED EMBODIMENTS

In accordance with principles of the present invention, a digital computing system or network 10 includes a bus, such as a low voltage differential, small computing system interface (LVD SCSI) bus 12. In accordance with accepted specifications for LVD SCSI buses, the bus 12 may have as many as 16 devices, or more, connected to it. Typically, the bus 12 is linear, and has a desired length l, extending from one end to another. However, the actual bus length parameter may not be available to a particular device attached to the bus, and distance to a nearest terminator unit may vary from device-to-device along the bus. The bus 12 typically supports a high speed synchronous transfer mode, and a lower speed asynchronous transfer mode. Bus transfer speed can be set by each device attached to the bus, so long as the bus speed remains within a maximum transfer rate specification of the bus. In one contemporary example for LVD SCSI, maximum bus speed is 80 megatransfers per second in high speed synchronous transfer mode.

Figure 1:
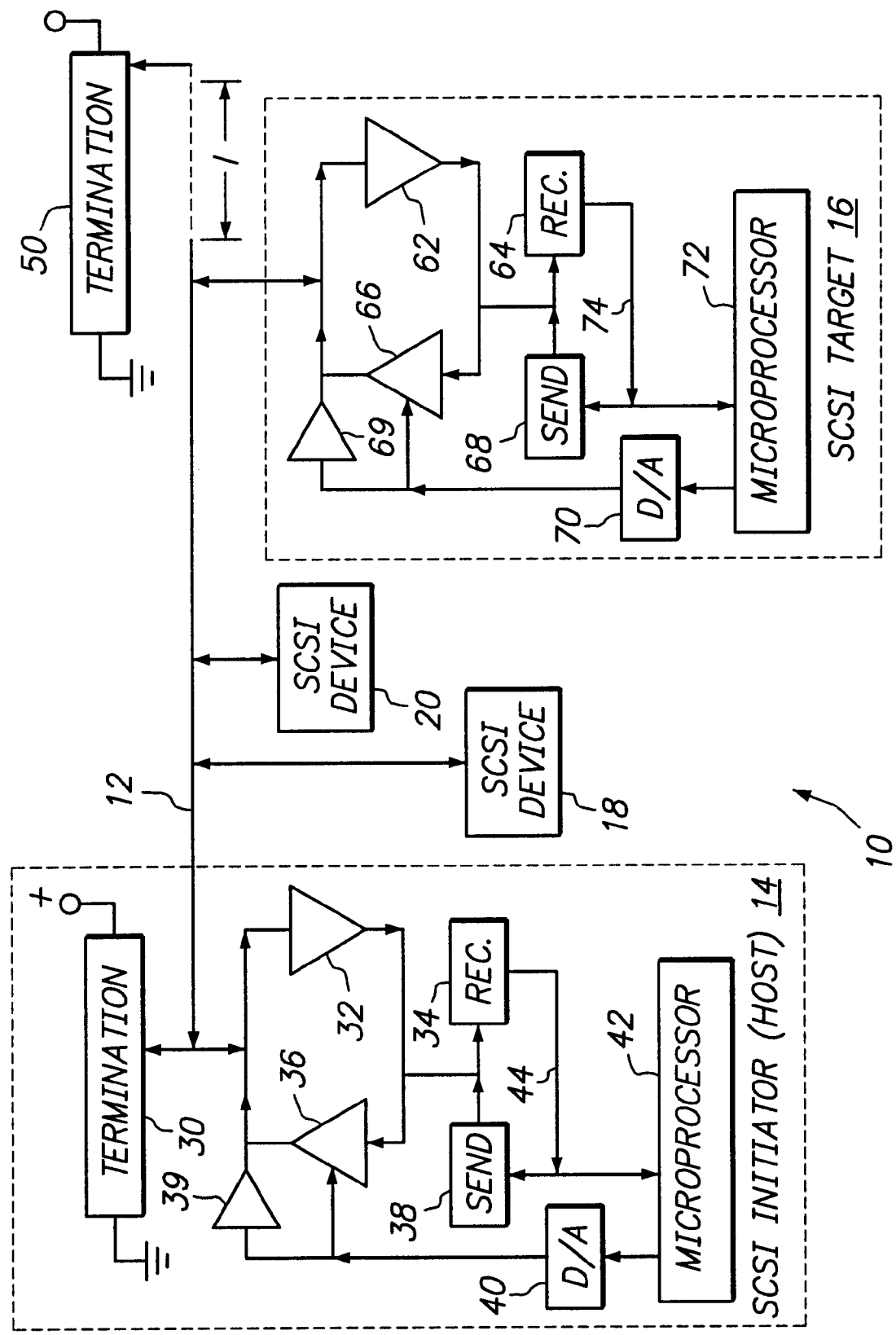
FIG. 1 is a block diagram of a computing system comprising plural computing elements interconnected via a bus structure and having controlled bus optimization elements in accordance with principles of the present invention.

Typically, a computing device, such as a SCSI host 14, includes a terminator 30, and a device most distantly located from the terminator 30 (not shown in FIG. 1) includes a second bus terminator 50. The bus terminators 30, 50 apply predetermined nominal logical negation bias current conditions to the data/control/status lines of the bus 12 in the absence of signals generated by the SCSI host device 14 acting as an initiator, or any other attached devices, such as a peripheral device 16, acting as targets. Of course, other SCSI devices may be attached to the bus 12 (a minimum complement of devices 18 and 20 being shown in FIG. 1, it being understood that a greater number of devices may actually be present on the bus 12).

The SCSI host device 14 typically includes a data receiver 32, and a received data register 34 for accumulating serial data values received from the bus 12. The device 14 also includes a data sender, such as a current mode driver 36 which in the present embodiment is capable of being controlled e.g. by an externally supplied analog current control value. A data send shift register 38 enables data words to be serially clocked out via the current driver 36 onto the bus 12. The device 14 further includes e.g. a bus bias cancellation circuit 39, and this circuit also is capable of being controlled e.g. by an externally supplied analog bias current cancellation value. A digital-to-analog converter (D/A) 40 is shown as providing analog control values to both the current mode driver 36 and to the bias cancellation circuit 39. In practice, a switch or multiplexer would typically be employed to separate the control paths from the D/A 40 to the circuits 36 and 39 and could be extended to multiple circuits 36, 39 driving multiple lines of the bus 12. Alternatively, and at greater expense, a separate D/A could be provided for each circuit 36, 39 and/or each bus line.

A microcontroller 42, typically embedded within the host 14 to perform a variety of desired control functions, is programmed in accordance with principles of the present invention to provide digital control words to the D/A 40. Thereby, the D/A 40 controls e.g. current magnitude of the current mode driver 36 within a first control range, and further controls bias cancellation magnitude of the bias cancellation circuit 39 within a second control range. Examples of hardware and control programs implementing principles of the present invention are set forth in FIGS. 2, 3 and 4. The microcontroller 42 also has direct access to the receive register 34 and to the send register 38 via an internal bus structure 44. This internal bus structure 44 enables the microcontroller 42 to receive test pattern words or symbol groups from the bus 12 via the receiver 32 and receive register 34; and, to send test pattern words or symbol groups over the bus 12 via the send register 38 and current mode driver 36.

Typically, although not necessarily, the host 14 is located at one end of the bus 12 and provides the terminator 30. The terminator 30 may comprise passive or active components, and it typically imposes a negation bias current onto each differential signal pair of the bus 12 in the absence of active signaling sent from one of the devices 14, 16, 18, 20, etc. The terminator 50 at the other end of the bus 12 may also comprise active or passive components, and it also applies a negation bias current to the bus 12 in the absence of active signaling of a device.

SCSI target device 16 is located on the bus 12 at an undefined location between the host terminator 30 and the distant terminator 50. Since these terminators are removed from direct proximity of the target device 16, it is expected that the bus degrading conditions are more likely to be present at a receiver 62 of the target device 16, than at a receiver closer to a terminator 30, 50. Put another way, it may be possible for the SCSI target device 16 to send data to the host 14 over bus 12 at a higher effective bus speed than the host can send to the target over the same bus.

The SCSI target device 16 also includes the elements noted above as included in the host. For example, in addition to the receiver 62, the target 16 includes a receive register 64, a current mode driver 66, a send register 68, a bias cancellation circuit 69, a D/A 70 and a programmed microcontroller 72. The microcontroller 72 controls the D/A 70 and is capable of receiving data from the receive register 64, and sending data via the send register 68, via a device internal bus structure 74.

Most preferably, although not necessarily, the other SCSI devices 18, 20, etc., attached to the bus 12 also include the structural elements and functions of the host 14 and target 16, as already described herein. In practice, the SCSI host may comprise a host computer, storage server central processing unit or other typical SCSI initiator device, while the SCSI target 16 may be a peripheral device, such as a hard disk drive, tape drive, or printer resource, for example.

Figure 2:
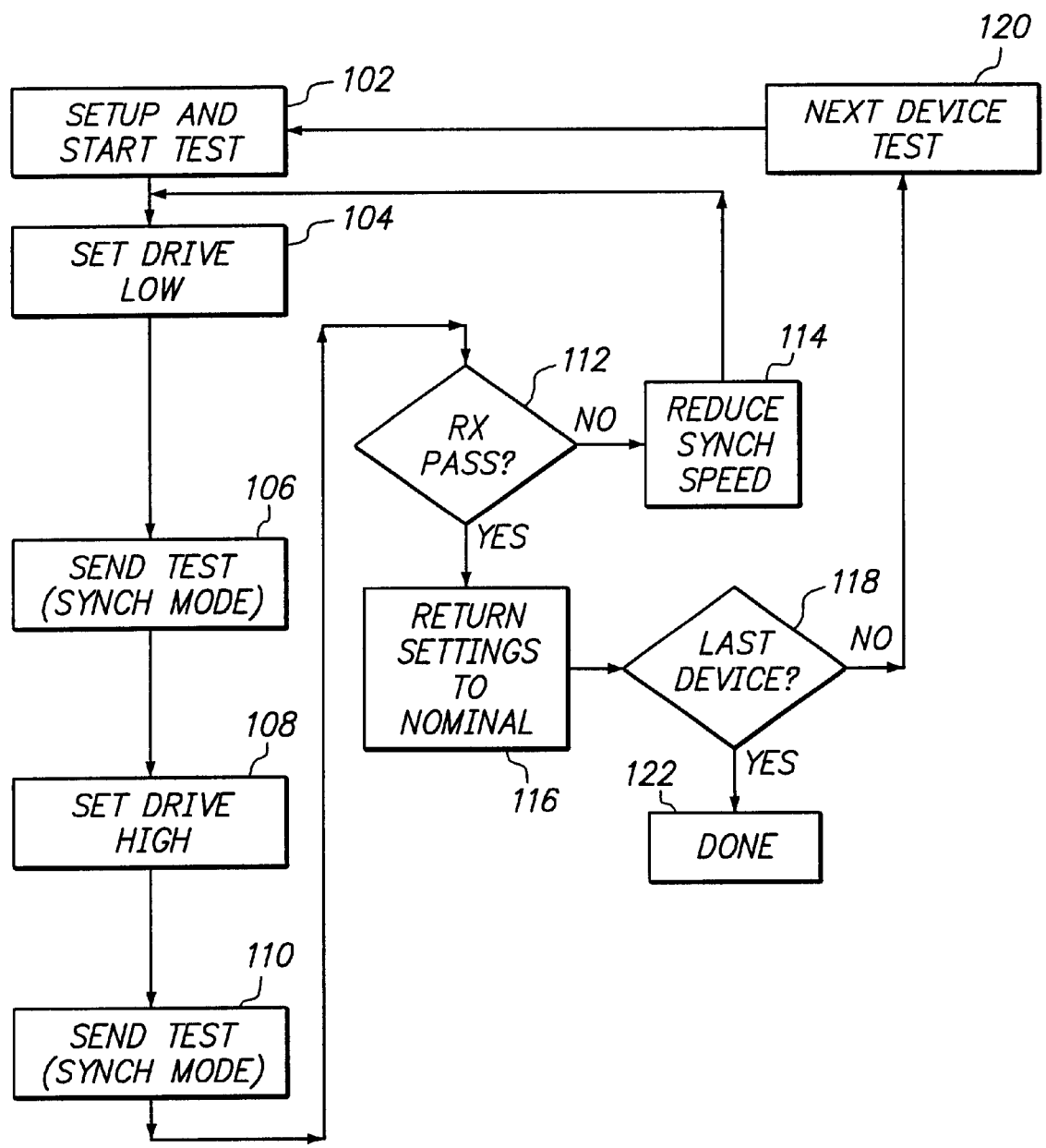
FIG. 2 is flow diagram illustrating a first, simplified implementation of principles of the present invention for optimizing a data bus.
Figure 3:
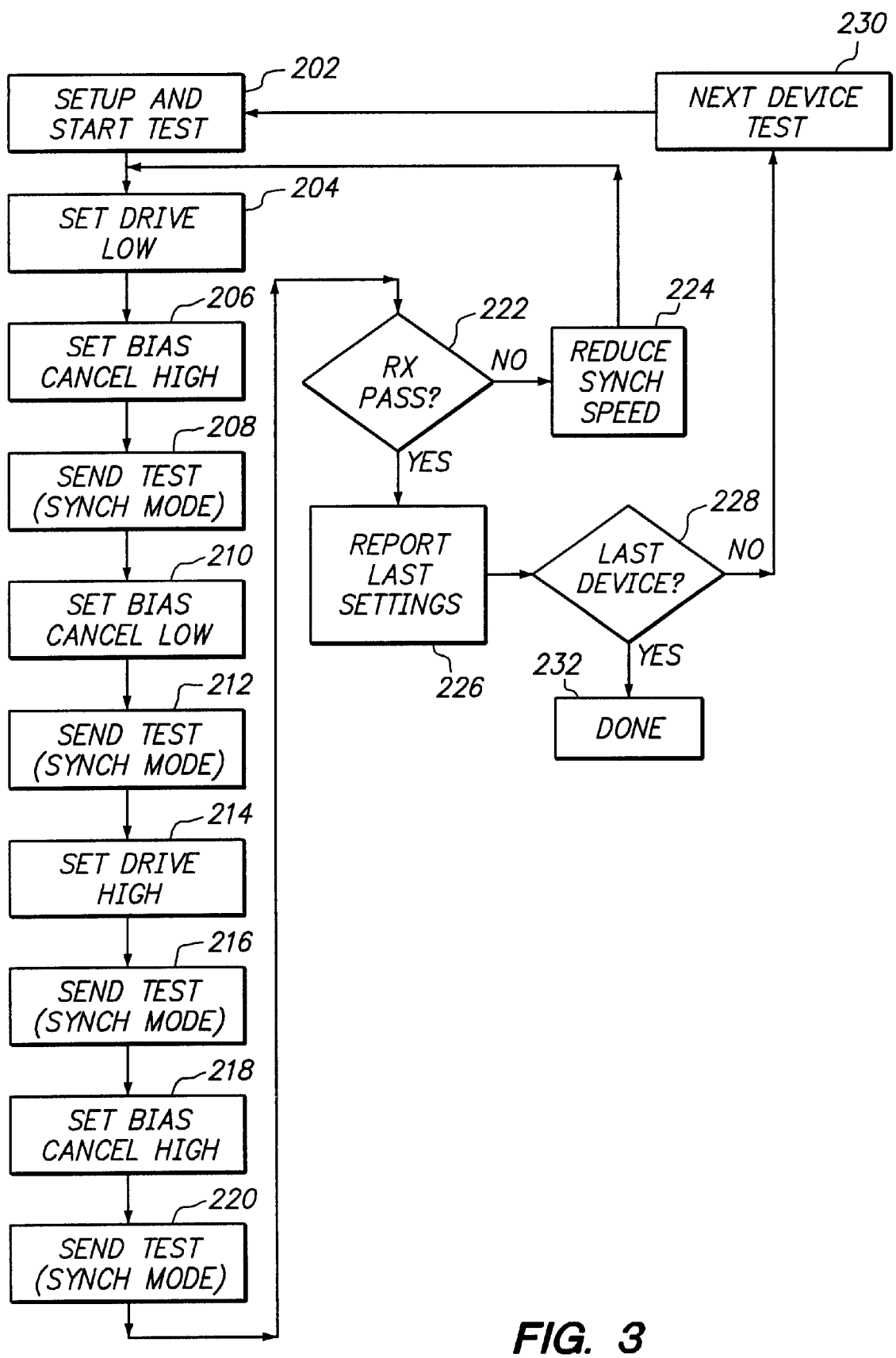
FIG. 3 is a flow diagram illustrating a second implementation of principles of the present invention for optimizing a data bus.
Figure 4:
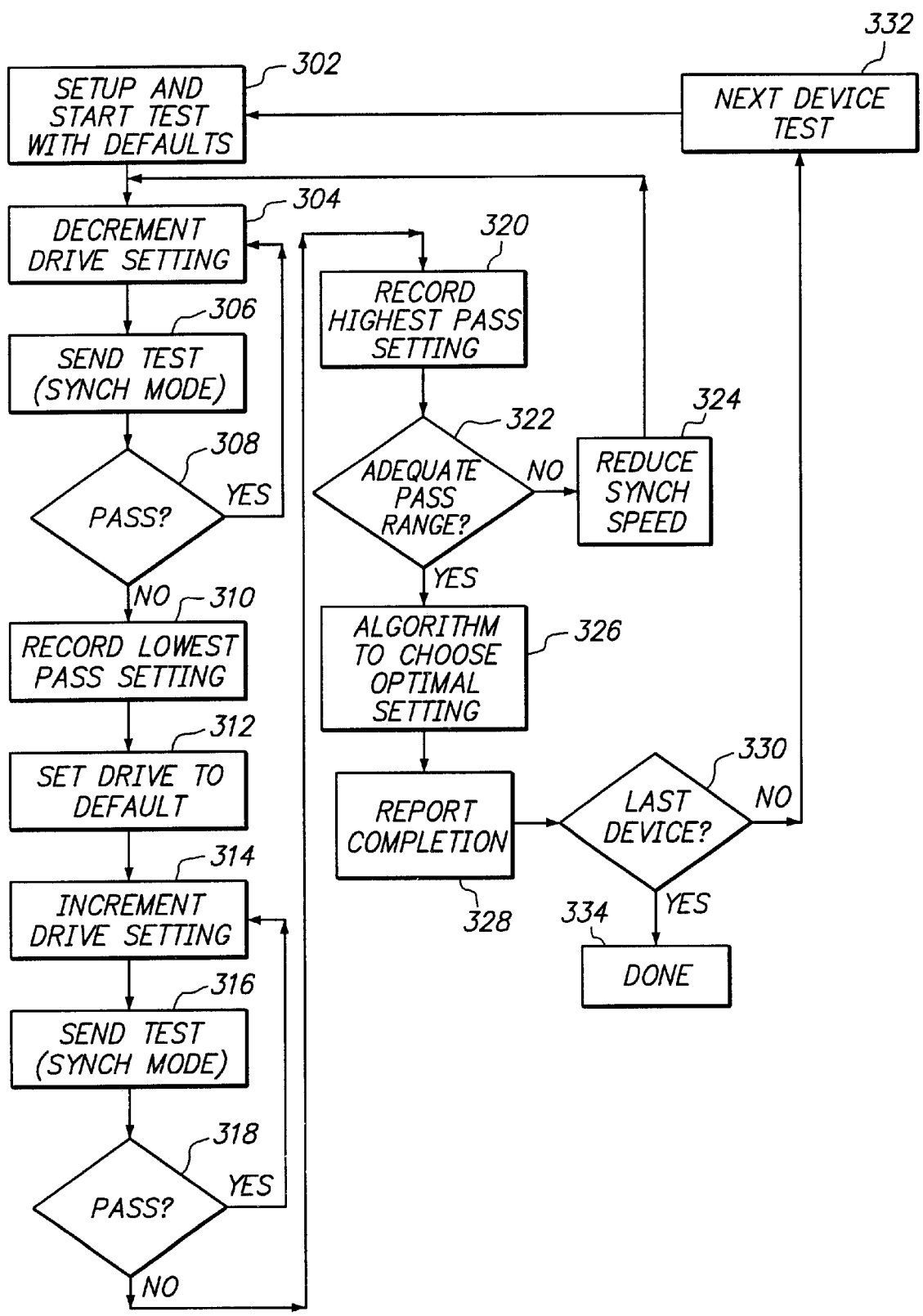
FIG. 4 is a flow diagram illustrating a third, and more complex, implementation of principles of the present invention for optimizing a data bus.

FIGS. 2, 3 and 4 demonstrate several implementations of the present invention with increasing levels of complexity and implementation cost. In FIG. 2 a hardware implementation of the present invention enables three settings of a parameter: high, default, and low. If the system is able to transfer data reliably at both high and low settings of the drive parameter, then the system is deemed to be robust for operation at the default or nominal (middle) setting.

Turning now to the FIG. 2 flow diagram, a first method for optimizing error rate margins of the bus 12 includes separate and complementary portions implemented in software routines within at least two separate devices attached to the LVD SCSI bus 12. In the FIG. 2 example, the control software implementing the method is installed to control the microcontroller 42 of the SCSI host 14 and the microcontroller 72 of the SCSI target 16. Advantageously, it can be installed in other devices, such as devices 18 and 20, assuming they also support adjustment e.g. of drive current and bias cancellation as in the manner of the host 14 and target 16, as described above in connection with FIG. 1.

The FIG. 2 method begins at a set-up-test and start-test step 102. Step 102 invokes the bus optimization routines at the microprocessors 42 and 72. Initially, one unit, such as the host 14, will send test patterns, and another unit, such as target 16 will receive and evaluate the test patterns. Then, sending and receiving functions will be reversed, with the target 16 sending test patterns and the host 14 receiving and evaluating the test patterns. Accordingly, a step 104 is executed by the host 14 to set drive current to a low level within the first control range at the current mode driver 36.

A sending step 106 causes a test pattern to be generated and sent in synchronous mode at low drive current across the LVD SCSI bus 12. The test pattern(s) is generated by the microcontroller 42 and sent via internal bus 44, send register 38 and current mode driver 36, onto the bus 12 at the host. The particular test pattern is conventionally selected to maximize likelihood of digital intersymbol interference in order to provide a robust performance test of the bus 12. A step 108 is then executed by the microcontroller 42, which causes the drive current to be set to a high level. Then, a sending step 110 causes the test pattern to be generated and sent in synchronous mode at high drive current from the host 14 to the target 16 via the bus 12.

A logical node 112, implemented e.g. at the target 16, determines whether the test patterns sent by the host 14 at low drive current and at high drive current settings have been accurately received. If not, a process step 114 reduces the synchronous transfer speed to a next lower setting within a range of transfer speeds, and the steps 104, 106, 108, 110, and 112 are repeated. Speed is lowered until a satisfactory transfer speed is determined. If the test patterns are accurately received at a particular transfer speed setting, a process step 116 returns the drive current setting to its nominal value (lying between the low level set at step 104 and high level set at step 108). A logical node 118 then determines if the present receiver device is the last device connected to the bus 12. If not, a process step 120 causes the next receiving device (such as device 18) to become active, and the test is repeated between the host 14 and the device 18. This progressive testing and transfer rate adjustment process continues until all transmitting devices and all receiving devices have been tested and parameters for each receiver and transmitter recorded locally at each device. Once all devices have been tested, as determined at logical node 118, a test completion state 122 is reached.

In the FIG. 3 example, the computing system enables multiple parameters to be varied for error rate margining purposes. The number of test sequences for N parameters therefore grows to $2^N$ test transmissions. Turning to FIG. 3 multi-parameter testing begins at a setup and start test step 202. The sending device's drive current is set low at a step 204. The sending device's bias cancellation current is set high at a step 206. A test pattern is then sent over the bus 12 in synchronous mode at a step 208. The bias cancellation current is set low at a step 210, and the test pattern is again sent at a step 212. Drive current at the sending device is set high at a step 214 and the test pattern is again sent at a step 216. Bias cancellation current is set high at a step 218 and the test pattern is again sent at a step 220.

The test patterns are evaluated at a logical step 222 at the receiving device. If the test patterns are not satisfactorily received, a process step 224 causes the receiving device to signal to the sending device to reduce synchronous transfer speed and then the steps 204–220 are repeated at the lower synchronous speed. Once a satisfactory synchronous transfer speed is found at logical node 222, the last settings 226 are reported to the sending unit. A process step 228 determines if the present sending-receiving pair is the last to be tested. If not, the next sending-receiving pair is set up at process step 230, and steps 202–226 are repeated. Once the last combination of sending and receiving devices is margined for error rate, the FIG. 3 process is completed, at step 232.

In the FIG. 4 example, further complexity in the hardware is implemented which enables more than three values of a parameter to be margined for error rate. Many more test transmissions are made so that pass/fail ranges for the chosen parameter may be determined with greater accuracy. Once a passing range is determined, then the passing range can be compared to a predetermined (preset) acceptable range. If the passing range is too narrow, then the synchronous bus transfer speed can be decreased to a lower rate. However, if the range is acceptable, then a new nominal setting for the predetermined parameter may be chosen. The choice can be as simple as an arithmetic mean, or the choice can reflect other considerations, such as prior history of field experience, or the values chosen for other parameters being margined. While FIG. 4 shows a single bus drive parameter being error-rate margined, the FIG. 4 exemplary method is clearly applicable to error-rate margining of multiple bus drive parameters which are tested at the receiving unit and iteratively adjusted at the sending unit.

Turning to FIG. 4, a step 302 causes the test to be set up and started with a default drive current setting. A step 304 causes the drive current setting to be decremented from the default setting to a lower level. A test pattern is then sent at a step 306. A logical node 308 determines if the test pattern is successfully received at a receiving device. If so, a return is made to step 304 and the drive current is reduced to another lower level and the test pattern resent at step 306. This process of lowering the drive level and resending the test pattern continues until a drive level is too low, as determined at the logical node 308. A process step 310 then records the lowest drive current level which resulted in a successful transmission of the test pattern. The drive current is then returned to the default setting at a step 312.

A step 314 then causes the drive current to be incremented to a higher level than the default setting. A test pattern is then sent at the higher drive current level by a process step 316, and a logical node 318 determines if the test pattern is successfully received at the higher drive current level. This process of increasing the drive current, sending the test pattern and checking at the receiver continues until the drive current reaches a level which results in failure to receive the test pattern accurately. Then, a process step 320 records the highest drive current level, which resulted in successful reception of the test pattern.

The pass drive current levels recorded at steps 310 and 320 are then compared at a step 322 to determine whether a range between lowest level and highest level lies within a predetermined satisfactory range. If not, the synchronous transmission speed is reduced by a process step 324 and the test of steps 304–322 is repeated until the satisfactory low/high drive current range is achieved. Then, an algorithm to derive an optimal drive current setting is executed at a step 326. As noted above, this algorithm may determine an arithmetic mean between the passing low and high drive current levels recorded respectively at steps 310 and 320. As further noted, the algorithm may additionally or alternatively impose adjustments resulting from field history statistical analyses, or in light of other sender/receiver parameters being margined.

Once the optimal drive current setting is chosen at step 326, a step 328 reports completion of the present test. A step 330 determines if the present sender/receiver is the last pair to be margined. If not, a step 332 selects the next pair and the steps 302-328 are repeated for that next pair. When all of the sending and receiving pairs have been successfully error-rate margined, the process is completed at step 334.

In carrying out the methods outlined in FIGS. 2,3 and 4, the test patterns are received and stored in local storage associated with the receiving device. The stored test patterns may then be directly accessed by the microcontroller 72 associated with the particular receiving device. The microcontroller 72 evaluates the received test patterns and determines whether the test patterns are received with an acceptable error rate. The microcontroller 72 may be programmed to make a pass/fail determination of a particular test pattern on one or more bases. Criteria include checking parity errors in the test pattern as received, CRC checking of the received test pattern, and/or comparison of the test pattern as received against a prestored test pattern template.

The flow diagrams of FIGS. 2, 3 and 4 illustrate the error rate margining process of the present invention from a system standpoint with a single sending device being margined at a time. Alternatively, and equally satisfactorily, the margining process can be distributed among all of the devices attached to the bus 12. A sending device could be tested by each connected receiving device during the margining process, and each receiving device can report its status when queried. Thus, each sending device maintains a set of sending parameters which are uniquely error-rate margined for each receiving device on the bus. When data is being sent from the sending device to a particular receiving device, the error-rate margined sending parameters for the sending/receiving device pair are used during data transfer.

In accordance with principles of the present invention, driver parameters are chosen automatically which maximize operating error margins in high-speed synchronous data transfer mode. Altered parameters may include optimization of a bias cancellation current, optimization of a signal current amplitude, optimization of a transient slew rate, optimization of a common mode voltage, application of intersymbol interference compensation techniques, and/or application of intersymbol interference compensation strength, etc. Should operating margins be negative or otherwise deemed inadequate, the sending device can be constrained under appropriate program control to transmit in synchronous mode at a slower speed than maximum which has been determined to achieve adequate data transfer reliability. After synchronous transfer operating speeds have been reduced by the present method, retrying higher speed operation may later be attempted automatically by the devices attached to the bus 12. Thus, transient or temporary degrading conditions (as by earlier attachment to, and later disconnection of, a device from bus 12) will be detected, and synchronous transfer speeds adjusted accordingly. Most preferably, although not necessarily, the methods of the present invention are carried out in the background of system data transfers over the bus, as during bus idle periods.

Although the present invention has been described in terms of the presently preferred embodiment which includes a low voltage differential, small computing system interface bus structure, it should be clear to those skilled in the art that the present invention may also be utilized in conjunction with, for example, other data bus structures, whether synchronous or asynchronous. Thus, it should be understood that the instant disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method for margining error rate of a multi-drop data bus comprising the steps of:
   determining a lowest acceptable level of a predetermined parameter at a highest nominal data transmission rate across the data bus,
   determining a highest acceptable level of the predetermined parameter at said transmission rate across the data bus,
   determining whether a difference between the determined lowest acceptable level and highest acceptable level is greater than a predetermined minimum error margin, and if so,
   setting the predetermined parameter to a nominal level lying between the determined lowest acceptable level and highest acceptable level at said first data transmission rate, and if not,
   repeating the steps of determining the lowest and highest acceptable levels at progressively reduced data transmission rate until the difference is determined to be greater than the predetermined minimum error margin, and setting the predetermined parameter to a nominal level lying between the determined lowest acceptable level and highest acceptable level at the reduced transmission rate.

2. The method set forth in claim 1 wherein the bus comprises a low voltage differential Small Computing System Interface bus and wherein the predetermined parameter comprises drive current of a sender connected to a drop along the bus.

3. The method set forth in claim 1 wherein the bus comprises a low voltage differential Small Computing System Interface bus and wherein a plurality of parameters are margined.

4. The method set forth in claim 3 wherein one of said parameters comprises drive current of a sender connected to a drop along the bus, and wherein another one of said parameters comprises bus bias cancellation current.

5. The method set forth in claim 1 wherein said parameter is selected from a group comprising data signal current amplitude, bus bias cancellation current, sending unit transient slew rate, common mode voltage, and digital intersymbol interference compensation.

6. The method set forth in claim 1 comprising the further step of repeating the steps of claim 1 periodically to adjust data transmission rate in relation to transient bus degrading conditions.

7. The method set forth in claim 6 wherein a transient bus degrading condition comprises electrically connecting and disconnecting a device at a drop along the bus.

8. The method set forth in claim 1 wherein multiple sending and receiving devices are connected at multiple drops along the bus, and the steps of claim 1 are carried out between each said sending and receiving device on the bus.

9. A method for optimizing data transfer rate across a low voltage differential Small Computing System Interface data bus to which a plurality of devices including a sending device and a receiving device are attached, the data bus supporting a nominal high speed synchronous transfer mode and receiving termination bias current from at least one bus terminator, the sending device having a controlled current mode driver and a programmed digital processor for controlling at least the current mode driver, the method comprising the steps of:
   determining a lowest acceptable level of a first predetermined operating parameter of said current mode driver at said nominal synchronous transfer mode,
   determining a highest acceptable level of said first predetermined operating parameter of said current mode driver at said nominal synchronous transfer mode,
   determining whether a difference between the determined lowest acceptable level and highest acceptable level is greater than a predetermined minimum error margin, and if so,
   setting the first predetermined operating parameter to a nominal value between the determined lowest acceptable level and highest acceptable level, and if not,
   reducing speed of the synchronous transfer mode and repeating the determining steps until a difference greater than the minimum error margin is determined at a lower speed, and
   setting said lower speed as a nominal bus transfer speed and setting said first predetermined operating parameter to a nominal value between the determined lowest acceptable level and highest acceptable level.

10. The method set forth in claim 9 wherein the determining steps comprise the steps of
   setting the first parameter to progressively lower levels and generating a data test pattern at the sending device and sending the data test pattern over said data bus at said progressively lower levels, receiving and checking the data test pattern at the receiving device until an unacceptably low level is determined at the receiving device, and signaling to the sending device a lowest acceptable level as the last sent acceptable low level, setting the first parameter to progressively higher levels and sending said data test pattern over said data bus at said progressively higher levels, receiving and checking the data test pattern at the receiving device until an unacceptably high level is determined at the receiving device and, signaling to the sending device a highest acceptable level as the last sent acceptable high level.

11. The method set forth in claim 9 wherein the method is carried out with respect to a plurality of operating parameters.

12. The method set forth in claim 9 wherein the first predetermined operating parameter is selected from a group comprising current mode driver data signal current amplitude, bus bias cancellation current, current mode driver transient slew rate, common mode voltage, and digital intersymbol interference compensation.

13. The method set forth in claim 9 wherein the step of generating and sending a test pattern comprises sending a plurality of test patterns, at least one of the plurality of test patterns selected to check digital inter-symbol interference.

14. The method set forth in claim 10 wherein the signaling steps comprise sending messages from the receiving device to the sending device over said bus using a low speed asynchronous data transfer mode.

15. A sending device including circuitry for optimizing data transfer rate across a data bus to which a plurality of devices including the sending device and a receiving device are attached, the bus supporting a high speed synchronous transfer mode, the circuitry comprising:

a controlled current mode driver for driving data onto the bus, a receiver for receiving data from the bus from the receiving device, and a programmed digital processor for controlling at least the current mode driver, including program control means for setting a first predetermined operating parameter of said current mode driver to a plurality of values within a first range, for sending onto said data bus a test pattern at plural settings of the range, and for determining an acceptable error rate margin in synchronous transfer mode in response to test pattern feedback returned from the receiving device, and means for reducing speed of said synchronous transfer mode until an acceptable error rate margin within said first range is determined.

16. The sending device set forth in claim 15 wherein the first predetermined operating parameter comprises data drive current.

17. The sending device set forth in claim 16 wherein the bus is a low voltage differential Small Computing Systems Interface (LVD SCSI) bus.

18. The sending device set forth in claim 17 wherein the bus receives termination bias current from a bus terminator, the sending device includes a controlled bias cancellation circuit for cancelling unwanted bias artifacts on the bus at the sending device, a second predetermined operating parameter comprises bus bias cancellation current, and the programmed digital processor controls the bias cancellation circuit and includes program control means for setting said bias cancellation current to a plurality of values within a second range, for sending onto said data bus a test pattern at plural settings of the second range, and for determining an acceptable error rate margin in synchronous transfer mode in response to test pattern feedback returned from the receiving device, and means for reducing speed of said synchronous transfer mode until an acceptable error rate margin within said second range is determined.

19. The sending device set forth in claim 15 wherein the first predetermined operating parameter comprises one of: drive current of the current mode driver, signal transient slew rate of the current mode driver, intersymbol interference compensation, and intersymbol interference compensation level.

20. The sending device set forth in claim 15 wherein the bus receives termination bias current from a bus terminator, the sending device includes a controlled bias cancellation circuit for cancelling unwanted bias artifacts On the bus at the sending device, a second predetermined operating parameter comprises bus common mode voltage level and the programmed digital processor controls the bias cancellation circuit and includes program control means for setting a bus common mode voltage level to a plurality of values within a second range, for sending onto said data bus a test pattern at plural settings of the second range, and for determining an acceptable error rate margin in synchronous transfer mode in response to test pattern feedback returned from the receiving device, and means for reducing speed of said synchronous transfer mode until an acceptable error rate margin within said second range is determined.

21. The sending device set forth in claim 15 wherein the receiver receives data over the bus from the receiving device via a low speed asynchronous data transfer mode.

22. The sending device set forth in claim 15 wherein the receiving device detects test pattern errors at each setting within the first range, and determines acceptable lowest and highest level settings of the first range and signals said acceptable levels to the sending device over the bus.

23. A receiving device including circuitry for optimizing data transfer rate across a data bus to which a plurality of devices including a sending device and the receiving device are attached, the bus supporting a high speed synchronous transfer mode, the circuitry comprising:

a receiver for receiving test pattern data from the bus from the sending device, a sender for sending test results to the sending device over the data bus, and a programmed digital processor having an operational mode for deriving test results from received test pattern data and for causing said sender to send said test results to the sending device to enable the sending device to determine an acceptable error rate margin of a predetermined bus operating parameter in the high speed synchronous transfer mode in response to the test results resumed from the receiving device, the sending device including means for reducing speed of said synchronous transfer mode until an acceptable error rate margin is determined.

24. The receiving device set forth in claim 23 wherein the predetermined bus operating parameter of the sending device comprises data drive current.

25. The receiving device set forth in claim 24 wherein the bus is a low voltage differential Small Computing Systems Interface (LVD SCSI) bus.

26. The receiving device set forth in claim 25 wherein the bus receives termination bias current from a bus terminator, the sending device includes a controlled bias cancellation circuit for canceling unwanted bias artifacts on the bus at the sending device, a second predetermined operating parameter comprises bus bias cancellation current, and a programmed digital processor of the sending device controls the bias cancellation circuit and includes program control means for setting said bias cancellation current to a plurality of values within a second range, for sending onto said data bus a test pattern at plural settings of the second range, and for determining an acceptable error rate margin in synchronous transfer mode in response to test results returned from the receiving device.

27. The receiving device set forth in claim 23 wherein the predetermined bus operating parameter of the sending device comprises one of: drive current of the current mode driver, signal transient slew rate of the current mode driver, intersymbol interference compensation, and intersymbol interference compensation level.

28. The receiving device set forth in claim 23 wherein the bus receives termination bias current from a bus terminator, the sending device includes a controlled bias cancellation circuit for canceling unwanted bias artifacts on the bus at the sending dice, a second predetermined operating parameter comprises bus common mode voltage level, and a programmed digital processor of the sending device controls the bias cancellation circuit and includes program control means for setting a bus common mode voltage level to a plurality of values within a second range, for sending onto said data bus a test pattern at plural settings of the second range, and for determining an acceptable error rate margin in synchronous transfer mode in response to test results returned from the receiving device.

29. The receiving device set forth in claim 23 wherein the sender returns test results to the sending device over the data bus via a low speed asynchronous data transfer mode.

30. The receiving device set forth in claim 23 wherein the programmed digital processor detects test pattern errors at each setting of the predetermined bus operating parameter within a first range, and determines acceptable lowest and highest level settings of the first range and signals as said test results said acceptable levels to the sending device over the bus.

* * * * *